United States Patent
Ho et al.

(10) Patent No.: US 12,113,587 B2
(45) Date of Patent: Oct. 8, 2024

(54) ECHO CANCELLING SYSTEM AND ECHO CANCELLING METHOD

(71) Applicant: Realtek Semiconductor Corporation, Hsinchu (TW)

(72) Inventors: Hsuan-Ting Ho, Hsinchu (TW); Liang-Wei Huang, Hsinchu (TW); Wei-Chiang Hsu, Hsinchu (TW); Wei-Jyun Wang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 407 days.

(21) Appl. No.: 17/506,725

(22) Filed: Oct. 21, 2021

(65) Prior Publication Data

US 2022/0337286 A1 Oct. 20, 2022

(30) Foreign Application Priority Data

Apr. 14, 2021 (TW) .................... 110113469

(51) Int. Cl.
*H04B 3/23* (2006.01)
*H03M 1/00* (2006.01)
*H03M 1/08* (2006.01)

(52) U.S. Cl.
CPC .............. *H04B 3/23* (2013.01); *H03M 1/001* (2013.01); *H03M 1/0854* (2013.01)

(58) Field of Classification Search
CPC ........ H04B 3/23; H03M 1/001; H03M 1/0854
See application file for complete search history.

(56) References Cited

U.S. PATENT DOCUMENTS

| | | | | |
|---|---|---|---|---|
| 6,240,132 B1* | 5/2001 | Yedid | .................. | H03H 17/0628 375/232 |
| 6,603,811 B1* | 8/2003 | Dobson | ............. | H04L 25/03159 375/232 |
| 6,829,314 B1* | 12/2004 | Zortea | .................... | H04B 1/525 375/232 |
| 7,269,211 B2* | 9/2007 | Lin | .......................... | H04B 3/23 379/3 |
| 8,040,943 B1* | 10/2011 | Babanezhad | .......... | H04B 3/238 375/232 |
| 8,451,885 B2* | 5/2013 | Agazzi | .................. | H04L 7/0334 375/348 |

(Continued)

*Primary Examiner* — Nicholas R Taylor
*Assistant Examiner* — Angela Widhalm De Rodriguez
(74) *Attorney, Agent, or Firm* — Locke Lord LLP; Tim Tingkang Xia, Esq.

(57) ABSTRACT

A digital-to-analog converter circuit generates an analog transmitted signal according to a digital transmitted signal. A first echo canceller circuit generates a first echo cancelling signal according to the digital transmitted signal. A processor circuit generates an analog processed signal according to the analog transmitted signal, the first echo cancelling signal, and a received signal. An analog-to-digital converter circuit generates a digital value according to the analog processed signal and two slicer levels of a plurality of slicer levels. A storage circuit stores a look-up table. The look-up table records an offset value corresponding to the digital value. The storage circuit further outputs a first output signal according to the digital value and the offset value. The offset value is updated according to an error value associated with the first output signal.

16 Claims, 6 Drawing Sheets

(56) References Cited

U.S. PATENT DOCUMENTS

| | | | | |
|---|---|---|---|---|
| 2003/0202617 A1* | 10/2003 | Casper | ............ | H04L 25/03057 |
| | | | | 375/317 |
| 2005/0123081 A1* | 6/2005 | Shirani | ................ | H04B 3/235 |
| | | | | 375/345 |
| 2011/0249778 A1* | 10/2011 | Azenkot | ............ | H04L 27/0014 |
| | | | | 375/343 |

* cited by examiner

| | CW | CW+OFF | |
|---|---|---|---|
| CW[+n] | +n x 2^-9 | +n x 2^-9 +OFF[+n] | CW[+n] +OFF[+n] |
| ..... | ..... | ..... | |
| CW[0] | 0 x 2^-9 | 0 x 2^-9 +OFF[0] | CW[0] +OFF[0] |
| ..... | ..... | ..... | |
| CW[-(n+1)] | -(n+1) x 2^-9 | -(n+1) x 2^-9 +OFF[-(n+1)] | CW[-(n+1)] +OFF[-(n+1)] |

LUT

FIG. 3

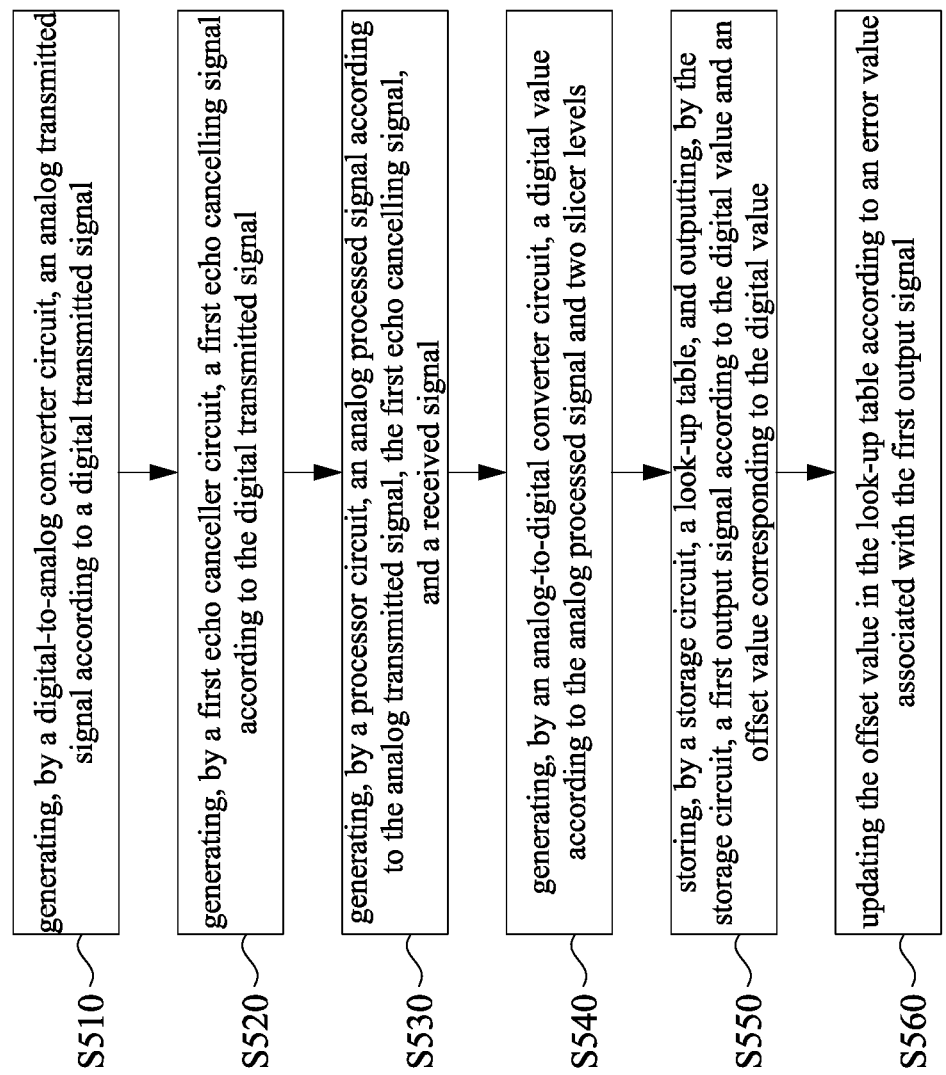

ECHO CANCELLING SYSTEM AND ECHO CANCELLING METHOD

RELATED APPLICATIONS

This application claims priority to Taiwanese Application Serial Number 110113469, filed Apr. 14, 2021, which is herein incorporated by reference.

BACKGROUND

Technical Field

The present disclosure relates to echo cancelling technology. More particularly, the present disclosure relates to an echo cancelling system and an echo cancelling method.

Description of Related Art

With development of communication technology, various communication systems are developed and are used in different applications. In a full-duplex system, signals with different directions (inward and outward) are transmitted via a pair of transmission lines respectively. When the impedances of the pair of transmission lines are not matched or the hybrid architecture design of the receiver is improper, the transmitted signal (outward) may be introduced into the received signal (inward) to cause echoes. In some related arts, echo cancelling technology can be used to cancel the echoes. However, when the slicer levels of an analog-to-digital circuit in a communication system are shifted, it may increase quantization noise and affect the signal-to-noise ratio (SNR) of the communication system.

SUMMARY

Some aspects of the present disclosure are to provide an echo cancelling system. The echo cancelling system includes a digital-to-analog converter circuit, a first echo canceller circuit, a processor circuit, an analog-to-digital converter circuit, and a storage circuit. The digital-to-analog converter circuit is configured to generate an analog transmitted signal according to a digital transmitted signal. The first echo canceller circuit is configured to generate a first echo cancelling signal according to the digital transmitted signal. The processor circuit is configured to generate an analog processed signal according to the analog transmitted signal, the first echo cancelling signal, and a received signal. The analog-to-digital converter circuit is configured to generate a digital value according to the analog processed signal and two slicer levels of a plurality of slicer levels. The storage circuit is configured to store a look-up table. The look-up table records an offset value corresponding to the digital value. The storage circuit is further configured to output a first output signal according to the digital value and the offset value. The offset value is updated according to an error value associated with the first output signal.

Some aspects of the present disclosure are to provide an echo cancelling method. The echo cancelling method includes following operations: generating, by a digital-to-analog converter circuit, an analog transmitted signal according to a digital transmitted signal; generating, by a first echo canceller circuit, a first echo cancelling signal according to the digital transmitted signal; generating, by a processor circuit, an analog processed signal according to the analog transmitted signal, the first echo cancelling signal, and a received signal; generating, by an analog-to-digital converter circuit, a digital value according to the analog processed signal and two slicer levels of a plurality of slicer levels; storing, by a storage circuit, a look-up table, and outputting, by the storage circuit, a first output signal according to the digital value and an offset value corresponding to the digital value, in which the look-up table records the offset value; and updating the offset value in the look-up table according to an error value associated with the first output signal.

As described above, in the echo cancelling system and the eco cancelling method of the present disclosure, the offset value can be updated according to the corresponding error value. Accordingly, even if the slicer levels are shifted, the output signal can be kept (almost) at the middle value between two shifted slicer values based on the updated offset value. Thus, the quantization noise can be minimized to maintain (or improve) the signal-to noise (SNR) ratio of the system.

BRIEF DESCRIPTION OF THE DRAWINGS

The disclosure can be more fully understood by reading the following detailed description of the embodiment, with reference made to the accompanying drawings as follows:

FIG. 3 is a schematic diagram of a look-up table according to some embodiments of the present disclosure.

FIG. 5 is a flow diagram of an echo cancelling method according to some embodiments of the present disclosure.

DETAILED DESCRIPTION

In the present disclosure, "connected" or "coupled" may refer to "electrically connected" or "electrically coupled." "Connected" or "coupled" may also refer to operations or actions between two or more elements.

Figure 1:
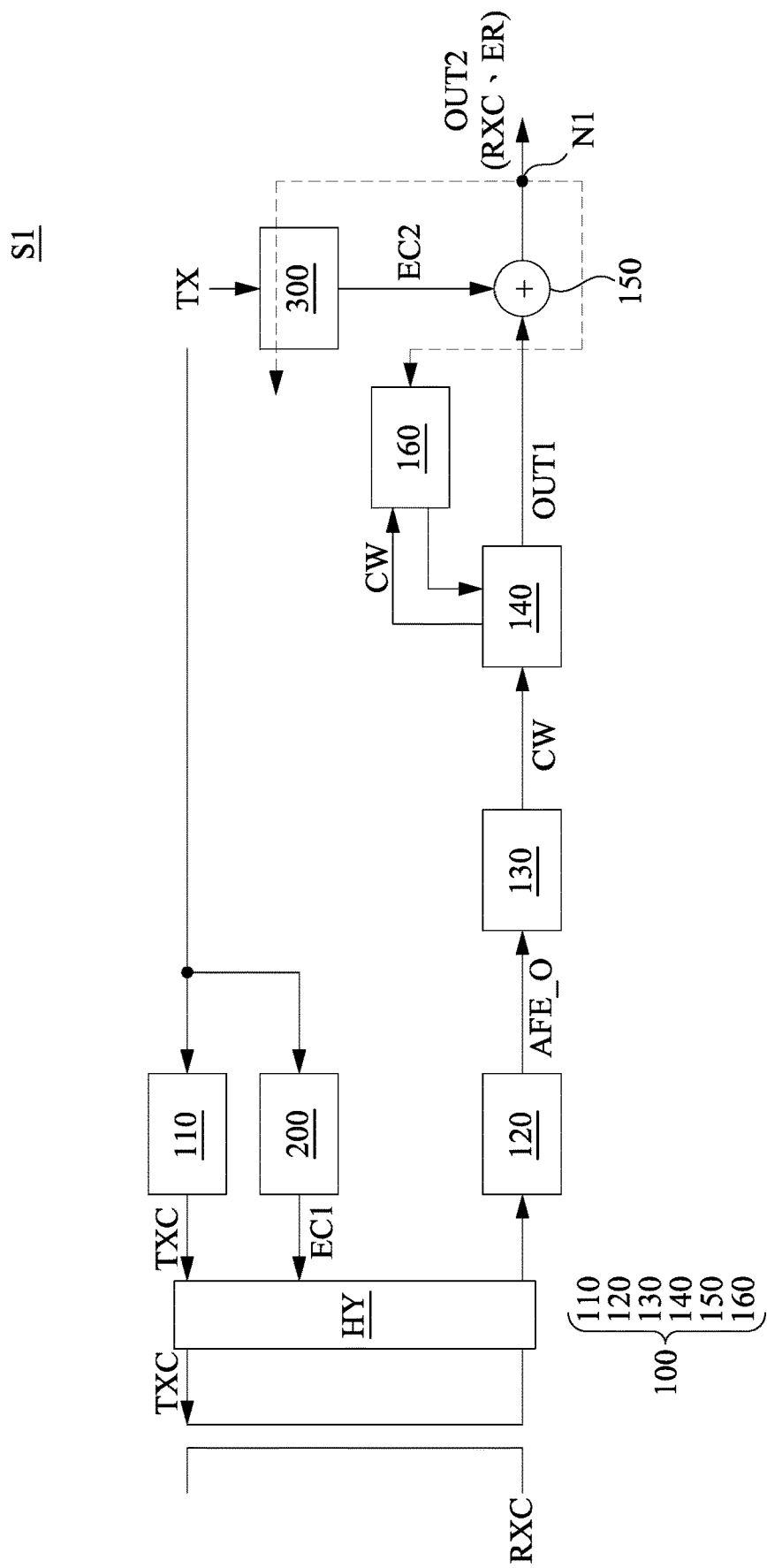
FIG. 1 is a schematic diagram of an echo cancelling system according to some embodiments of the present disclosure.

Reference is made to FIG. 1. FIG. 1 is a schematic diagram of an echo cancelling system S1 according to some embodiments of the present disclosure. In some embodiments, the echo cancelling system S1 is applied to an Ethernet system.

In some embodiments, the echo cancelling system S1 is a Full-Duplex system. In other words, a pair of transmissions lines are disposed in the system. One of the transmissions lines carries transmitted signals and the other carries received signals. As shown in FIG. 1, a transmitted signal TX1 illustrates the transmitted signal of the echo cancelling system S1. A received signal RXC illustrates the received signal of the echo cancelling system S1.

As illustrated in FIG. 1, the echo cancelling system S1 includes a data transmitter circuit 100, an echo canceller circuit 200, and an echo canceller circuit 300. The data transmitter circuit 100 is coupled to the echo canceller circuit 200 and the echo canceller circuit 300.

The data transmitter circuit 100 includes a digital-to-analog converter (DAC) circuit 110, a processor circuit 120, an analog-to-digital converter (ADC) circuit 130, a storage circuit 140, a combination circuit 150, and an updating circuit 160. The digital-to-analog converter circuit 110 and the echo canceller circuit 200 are coupled to the processor circuit 120. For example, the digital-to-analog converter circuit 110 and the echo canceller circuit 200 can be coupled to the processor circuit 120 through a hybrid circuit HY. The processor circuit 120 is coupled to the analog-to-digital converter circuit 130. The analog-to-digital converter circuit 130 is coupled to the storage circuit 140. The storage circuit 140 is coupled to the combination circuit 150 and the updating circuit 160. The combination circuit 150 is coupled to the updating circuit 160. The echo canceller circuit 300 is coupled to the combination circuit 150.

The digital-to-analog converter circuit 110 can receive a digital transmitted signal TX. The digital-to-analog converter circuit 110 can generate an analog transmitted signal TXC according to the digital transmitted signal TX. For example, the digital-to-analog converter circuit 110 can perform a digital-to-analog conversion process to convert the digital transmitted signal TX into the analog transmitted signal TXC. The analog transmitted signal TXC can be outputted through the hybrid circuit HY to external units (outside of the data transmitter circuit 100).

The processor circuit 120 can receive a received signal RXC from the external units and generate an analog processed signal AFE_O according to the received signal RXC. In some embodiments, the processor circuit 120 can be implemented by one analog front-end processor circuit.

However, in some situations (e.g., impedances of the two transmission lines are not matched or the hybrid structure of the receiver device is improper), the analog transmitted signal TXC may be introduced (e.g., through the hybrid circuit HY) to the transmission line that carries the received signal RXC such that echoes are generated.

The echo canceller circuit 200 can also receive the digital transmitted signal TX. The echo canceller circuit 200 can generate an echo cancelling signal EC1 according to the digital transmitted signal TX in order to cancel most of the echoes at the analog side of the system. For example, the hybrid circuit HY can subtract the echo cancelling signal EC1 from the analog transmitted signal TXC and input the calculation result into the processor circuit 120. In some embodiments, the hybrid circuit HY includes two current sources, in which one corresponds to the analog transmitted signal TXC, and the other corresponds to the echo cancelling signal EC1. In some embodiments, the echo canceller circuit 200 at least includes one digital-to-analog converter circuit (not shown) and one filter circuit (not shown).

The echo canceller circuit 300 can receive the digital transmitted signal TX. The echo canceller circuit 300 can generate an echo cancelling signal EC2 according to the digital transmitted signal TX in order to cancel the residual echoes at the digital end of the system. In some embodiments, the echo canceller circuit 300 at least includes one filter circuit (not shown).

The echo cancelling signals EC1 and EC2 can be used to cancel echoes to increase the signal-to-noise ratio (SNR) of the echo cancelling system S1.

As described above, when the analog transmitted signal TXC is introduced into the transmission line that carries the received signal RXC, echoes are generated. In other words, the processor circuit 120 receives part of or all of the analog transmitted signal TXC, and generates the analog processed signal AFE_O according to the analog transmitted signal TXC, the echo cancelling signal EC1, and the received signal RXC.

The analog-to-digital converter circuit 130 can receive the analog processed signal AFE_O, and perform an analog-to-digital conversion process on the analog processed signal AFE_O to convert the analog processed signal AFE_O into a digital value CW (e.g., code-word).

Figure 2A:
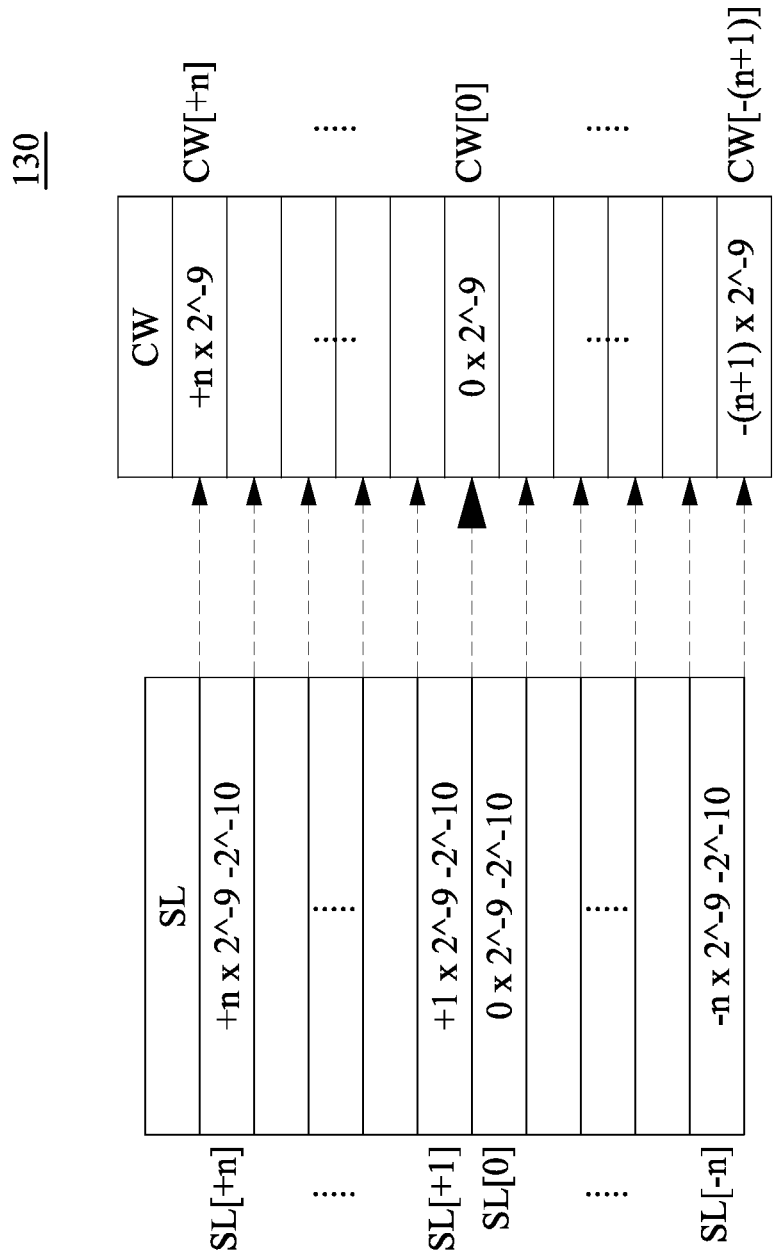
FIG. 2A is a schematic diagram of operations of an analog-to-digital converter circuit with normal slicer levels according to some embodiments of the present disclosure.

Reference is made to FIG. 2A. FIG. 2A is a schematic diagram of operations of the analog-to-digital converter circuit 130 with normal slicer levels SL (i.e., the slicer levels SL in FIG. 2A are not shifted) according to some embodiments of the present disclosure.

In some embodiments, the analog-to-digital converter circuit 130 can map the slicer levels SL to a plurality of digital values CW respectively (i.e., through an analog-to-digital conversion function). As illustrated in FIG. 2A, the slicer levels SL include slicer levels SL[−n]-SL[+n], and the digital values CW include digital values CW[−(n+1)]-CW[+n]. To be more specific, two adjacent slicer levels SL are mapped to one digital value CW. The digital value CW can substantially be a middle value between the two adjacent slicer levels SL, but the present disclosure is not limited thereto. When a level of the received analog processed signal AFE_O falls between two adjacent slicer levels SL (i.e., one is closest to and greater than the level of the analog processed signal AFE_O, the other is closest to and less than the level of the analog processed signal AFE_O), the analog-to-digital converter circuit 130 can determine the two adjacent slicer levels SL from the slicer levels SL, and the analog-to-digital converter circuit 130 can select and output the digital value CW corresponding to the two adjacent slicer levels SL. For example, the slicer level SL[+1] and the slicer level SL[0] are mapped to the digital value CW[0]. Accordingly, when the analog-to-digital converter circuit 130 determine that the level of the received analog processed signal AFE_O is between the two adjacent slicer levels SL[+1] and SL[0], the analog-to-digital converter circuit 130 selects the digital value CW[0] and outputs the digital value CW[0].

Based on the operations above, the analog-to-digital converter circuit 130 maps all levels between the two slicer levels SL[0] and SL[+1] to one digital value CW[0]. It can be understood that the analog-to-digital converter circuit 130 defines a plurality of level ranges. When the level of the analog processed signal AFE_O is in one of the level ranges, the analog-to-digital converter circuit 130 outputs the digital value CW corresponding to this level range. However, most of levels in this level range are not identical to the digital value CW[0]. Accordingly, in most cases, there is a difference (i.e., noise) between the level of the analog processed signal AFE_O and the level of the digital value CW outputted by the analog-to-digital converter circuit 130. The noise is also called "quantization noise".

Figure 2B:
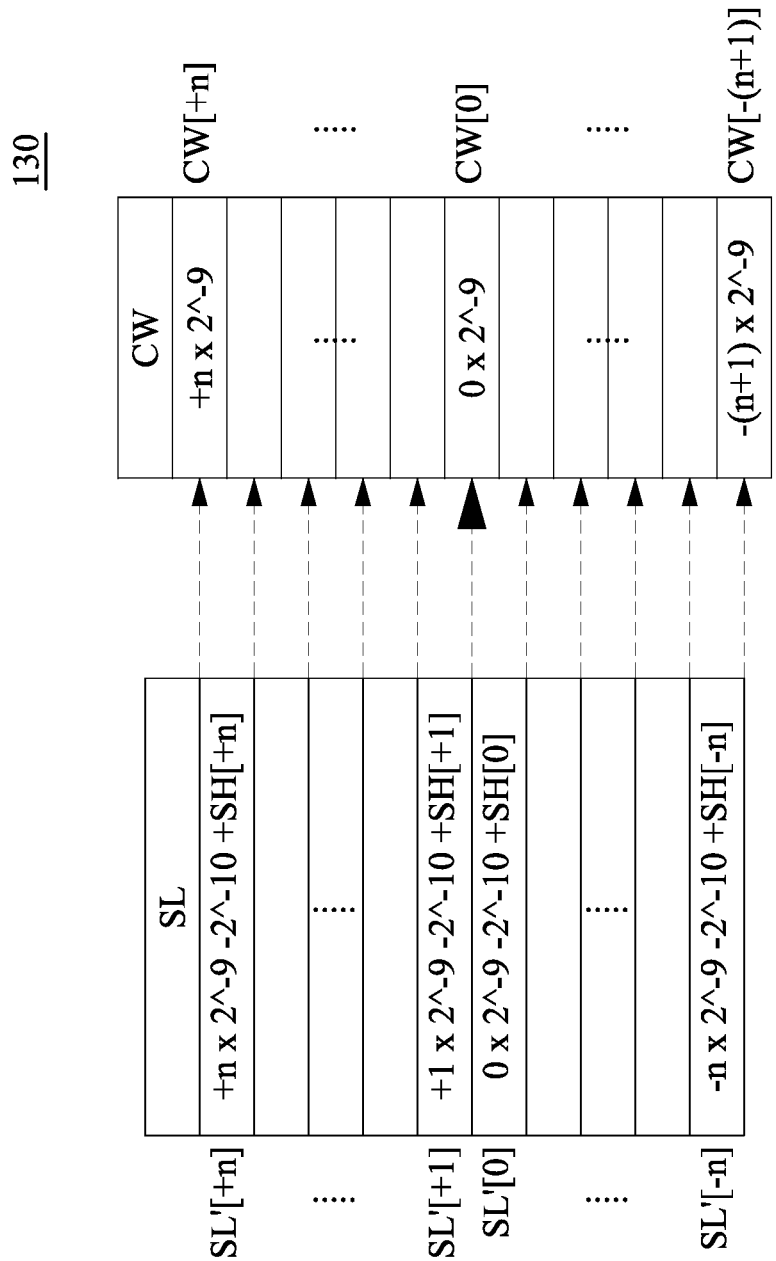
FIG. 2B is a schematic diagram of operations of an analog-to-digital converter circuit with shifted slicer levels according to some embodiments of the present disclosure.

References are made to FIG. 2A and FIG. 2B. FIG. 2B is a schematic diagram of operations of the analog-to-digital converter circuit 130 with shifted slicer levels SL according to some embodiments of the present disclosure.

In some embodiments, these slicer levels SL are shifted from their original levels due to process or temperature variation. In other words, shift values SH[−n]−SH[+n] are introduced into shifted slicer levels SL'[−n]−SL'[+n], respectively. For example, when a difference between the shifted slicer level SL'[+1] and the shifted slicer level SL'[0] in FIG. 2B is greater than a difference between the normal slicer level SL[+1] and the normal slicer level SL[0] in FIG. 2A, more levels in FIG. 2B are mapped to the digital value CW[0] (i.e., the aforementioned level range increases to further include additional levels). The difference between each additional level and the digital value CW[0] is greater, so the quantization noise of the analog-to-digital converter circuit 130 increases.

For avoiding the problems above, in the present disclosure, the storage circuit 140 can store a look-up table (as a look-up table LUT in FIG. 3). In some embodiments, the storage circuit 140 is implemented by a register.

Reference is made to FIG. 3. FIG. 3 is a schematic diagram of the look-up table LUT according to some embodiments of the present disclosure. As illustrated in FIG. 3, the look-up table LUT records the digital values CW[−(n+1)]-CW[+n] and corresponding offset values OFF[−(n+1)]-OFF[+n].

Taking the digital value CW[0] as an example, in the look-up table LUT, the digital value CW[0] corresponds to a sum of the digital value CW[0] and the offset value OFF[0]. Accordingly, as described above, according to FIG. 2B, when the analog-to-digital converter circuit 130 determines the level of the received analog processed signal AFE_O is between the shifted slicer level SL'[0] and the shifted slicer level SL'[+1], the analog-to-digital converter circuit 130 can select the corresponding digital value CW[0]. Then, the storage circuit 140 can use the look-up table LUT in FIG. 3 (or other control circuits can use the look-up table LUT in the storage circuit 140) to output the sum of the digital value CW[0] and the offset value OFF[0] as an output signal OUT1 in FIG. 1. In some embodiments, initial values of the offset values OFF[−(n+1)]-OFF[+n] are 0 and can be updated by the updating circuit 160 to converge to appropriate values. Related operations are described in paragraphs below.

Reference is made to FIG. 1 again. The digital value CW outputted from the analog-to-digital converter circuit 130 is converted into the output signal OUT1 by the storage circuit 140, and the combination circuit 150 can receive the output signal OUT1. The combination circuit 150 can generate an output signal OUT2 according to the output signal OUT1 and the echo cancelling signal EC2. For example, the combination circuit 150 combines the output signal OUT1 and the echo cancelling signal EC2 to generate the output signal OUT2. The output signal OUT2 can reflect the received signal RXC and an error value ER. For example, the error value ER includes echoes which are not completely eliminated in the output signal OUT2 and quantization noise (e.g., the quantization noise corresponding to original slicer levels, the quantization noise corresponding to shifted slicer levels).

In some embodiments, in some initial working cycles (for example 10 working cycles, but the present disclosure is not limited thereto), filter coefficients of the echo canceller circuit 300 can be updated according to the output signal OUT2 and a least mean square (LMS) calculation process. When the filter coefficients of the echo canceller circuit 300 are stable, the offset values OFF[−(n+1)]-OFF[+n] are updated (as formula (1) below). During each working cycle, the offset values OFF[−(n+1)]-OFF[+n] can be updated more than once.

References are made to FIG. 1 and FIG. 3. As described above, the updating circuit 160 can update the offset values OFF[−(n+1)]-OFF[+n] in the look-up table LUT. For example, as illustrated in FIG. 1, when the analog-to-digital converter circuit 130 selects and outputs the digital value CW[0], the updating circuit 160 can update the offset value OFF[0] corresponding to the digital value CW[0] according to the digital value CW[0] and the output signal OUT2 (the output signal OUT2 can reflect the error value ER corresponding to the digital value CW[0]). In some embodiments, the updating circuit 160 can update each offset value according to formula (1) below:

$$OFF[i]=OFF[i]-M\times ER \quad (1)$$

in which a range of i is from −(n+1) to +n, n is a positive integer, OFF[i] on the right-hand side of the equal sign is a current offset value, M is an intensity value and can be designed according to system requirements, ER is the error value, and OFF[i] on the left-hand side of the equal sign is an updated offset value.

The intensity value above is associated with Eigen-values of the LMS calculation process of the system, and a range of the intensity value is, for example, $2^{-10}$-$2^{-5}$, but the present disclosure is not limited thereto.

For example, when the offset value OFF[0] is updated by formula (1) above, the updated offset value OFF[0] is almost equal to or substantially equal to a middle value between the shift value SH[0] and the shift value SH[+1].

When the analog-to-digital converter circuit 130 accumulates the operation of selecting and outputting the digital value CW[0], the updated offset value OFF[0] can be closer to the middle value between the shift value SH[0] and the shift value SH[+1]. Accordingly, the quantization noise can be minimized. On the contrary, when the analog-to-digital converter circuit 130 fails to select and output the digital value CW[0] (without accumulation), the offset value OFF[0] cannot be updated. However, if the digital value CW[0] is never selected by the analog-to-digital converter circuit 130, it indicates that the analog processed signal AFE_O has no (or few) level corresponding to the digital value CW[0]. In this situation, even if the offset value OFF[0] is not updated, the quantization noise is not affected by the shifted slicer levels.

It is noted that the offset value OFF[0] can be updated according to the error value ER reflected on the node N1 where the output signal OUT2 is generated, but the present disclosure is not limited thereto. In some other embodiments, the offset value OFF[0] can be updated according to internal nodes of other back-end circuits.

Based on operations above, in the present disclosure, the updated offset value OFF[0] can be updated to be almost equal to or substantially equal to the middle value between the shift value SH[0] and the shift value SH[+1] without modifying the shifted slicer levels SL'[0]-SL'[+1] of the analog-to-digital converter circuit 130. Accordingly, the output signal OUT1 (the sum of the digital value CW[0] and the updated offset value OFF[0]) is substantially kept at the middle value between two corresponding shifted slicer levels to minimize the quantization noise and maintain (or increase) the SNR of the system.

In addition, for better understanding, the paragraphs above are described by taking the digital value CW[0] as an example. Other digital values CW are similar to the digital value CW[0], so they are not described herein again.

Figure 4:
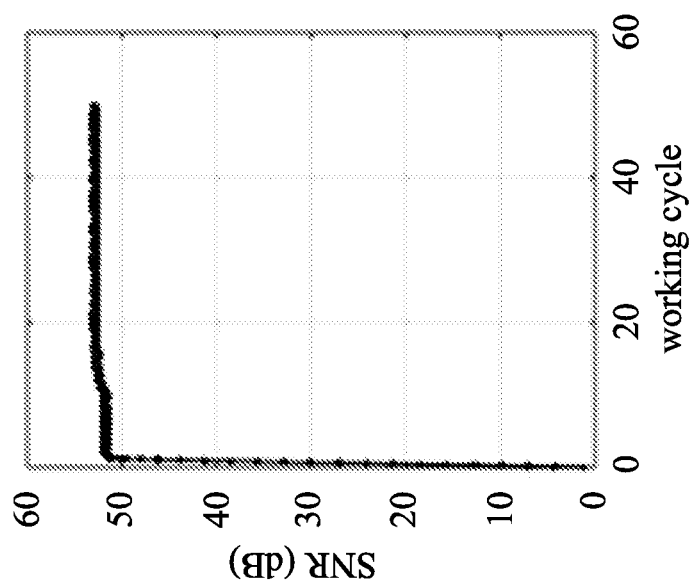
FIG. 4 is a schematic diagram of a signal-to-noise ratio according to some embodiments of the present disclosure.

Reference is made to FIG. 4. FIG. 4 is a schematic diagram of the SNR according to some embodiments of the present disclosure. As illustrated in FIG. 4, after 10 working cycles, the SNR of the system can be increased by 1 to 3 decibel (dB).

References are made to FIG. 1 to FIG. 5. FIG. 5 is a flow diagram of an echo cancelling method 500 according to some embodiments of the present disclosure. The echo cancelling method 500 includes operations S510, S520, S530, S540, S550, and S560.

In operation S510, the digital-to-analog converter circuit 110 generates the analog transmitted signal TXC according to the digital transmitted signal TX. In some embodiments, the digital-to-analog converter circuit 110 can perform the digital-to-analog conversion process to convert the digital transmitted signal TX into the analog transmitted signal TXC.

In operation S520, the echo canceller circuit 200 generates the echo cancelling signal EC1 according to the digital transmitted signal TX. In some embodiments, the echo canceller circuit 200 at least includes one digital-to-analog converter circuit and one filter circuit to generate the echo cancelling signal EC1 in order to cancel most of the echoes at the analog side of the system.

In operation S530, the processor circuit 120 generates the analog processed signal AFE_O according to the analog transmitted signal TXC, the echo cancelling signal EC1, and the received signal RXC. In some embodiments, the processor circuit 120 can be implemented by one analog front-end processor circuit.

In operation S540, the analog-to-digital converter circuit 130 generates the digital value CW according to the analog processed signal AFE_O and two corresponding slicer levels SL. In some embodiments, the digital value CW can be substantially equal to the middle value between the two corresponding slicer levels SL. When the analog-to-digital converter circuit 130 determines that the level of the analog processed signal AFE_O is between the two corresponding slicer levels SL, the analog-to-digital converter circuit 130 outputs the digital value CW.

In operation S550, the storage circuit 140 stores the look-up table LUT and outputs the output signal OUT1 according to the digital value CW and an offset value OFF corresponding to the digital value CW. In some embodiments, the two corresponding slicer levels SL may be shifted from their original levels due to process or temperature variation. Accordingly, the offset value OFF can be updated according to formula (1) above, and the storage circuit 140 can output the sum of the digital value CW and the updated offset value OFF as the output signal OUT1 according to the digital value CW outputted from the analog-to-digital converter circuit 130.

Operation S560 is updating the offset value OFF according to the error value ER. In some embodiments, the offset value OFF is updated according to formula (1) above, and the error value ER is associated with the output signal OUT1 outputted from the storage circuit 140 (the output signal OUT2 reflects the error value ER, and the output signal OUT2 is generated according to the output signal OUT1).

As described above, in the echo cancelling system and the eco cancelling method of the present disclosure, the offset value can be updated according to the corresponding error value. Accordingly, even if the slicer levels are shifted, the output signal can be kept (almost) at the middle value between two shifted slicer values based on the updated offset value. Thus, the quantization noise can be minimized to maintain (or improve) the SNR of the system.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An echo cancelling system, comprising:
a digital-to-analog converter circuit configured to generate an analog transmitted signal according to a digital transmitted signal;
a first echo canceller circuit configured to generate a first echo cancelling signal according to the digital transmitted signal;
a processor circuit configured to generate an analog processed signal according to the analog transmitted signal, the first echo cancelling signal, and a received signal;
an analog-to-digital converter circuit configured to generate a digital value according to the analog processed signal and two slicer levels of a plurality of slicer levels; and
a storage circuit configured to store a look-up table, wherein the look-up table records an offset value corresponding to the digital value, wherein the storage circuit is further configured to output a first output signal according to the digital value and the offset value,
wherein the offset value is updated according to an error value associated with the first output signal, the two slicer levels correspond to two shift values respectively, the offset value corresponding to the digital value is updated according to the two shift values corresponding to the two slicer levels to generate an updated offset value, and a sum of the digital value and the updated offset value forms the first output signal.

2. The echo cancelling system of claim 1, further comprising:
a second echo canceller circuit configured to generate a second echo cancelling signal according to the digital transmitted signal; and
a combination circuit configured to generate a second output signal according to the first output signal and the second echo cancelling signal.

3. The echo cancelling system of claim 2, wherein the second output signal reflects the received signal and the error value.

4. The echo cancelling system of claim 2, wherein an initial value of the offset value corresponding to the digital value is 0.

5. The echo cancelling system of claim 4, wherein the offset value corresponding to the digital value is updated according to a current offset value, an intensity value, and the error value.

6. The echo cancelling system of claim 1, wherein the updated offset value is substantially equal to a middle value between the two shift values corresponding to the two slicer levels.

7. The echo cancelling system of claim 2, further comprising:
an updating circuit coupled to the storage circuit and the combination circuit to receive the digital value and the second output signal so as to update the offset value corresponding to the digital value.

8. The echo cancelling system of claim 2, wherein a plurality of filter coefficients of the second echo canceller circuit are updated according to the second output signal and a least mean square calculation process.

9. An echo cancelling method, comprising:
generating, by a digital-to-analog converter circuit, an analog transmitted signal according to a digital transmitted signal;

generating, by a first echo canceller circuit, a first echo cancelling signal according to the digital transmitted signal;

generating, by a processor circuit, an analog processed signal according to the analog transmitted signal, the first echo cancelling signal, and a received signal;

generating, by an analog-to-digital converter circuit, a digital value according to the analog processed signal and two slicer levels of a plurality of slicer levels;

storing, by a storage circuit, a look-up table, and outputting, by the storage circuit, a first output signal according to the digital value and an offset value corresponding to the digital value, wherein the look-up table records the offset value; and updating the offset value in the look-up table according to an error value associated with the first output signal, wherein the two slicer levels correspond to two shift values respectively, the offset value corresponding to the digital value is updated according to the two shift values corresponding to the two slicer levels to generate an updated offset value, and a sum of the digital value and the updated offset value forms the first output signal.

10. The echo cancelling method of claim 9, further comprising:

generating, by a second echo canceller circuit, a second echo cancelling signal according to the digital transmitted signal; and generating, by a combination circuit, a second output signal according to the first output signal and the second echo cancelling signal.

11. The echo cancelling method of claim 10, wherein the second output signal reflects the received signal and the error value.

12. The echo cancelling method of claim 10, wherein an initial value of the offset value corresponding to the digital value is 0.

13. The echo cancelling method of claim 12, further comprising:

updating the offset value corresponding to the digital value according to a current offset value, an intensity value, and the error value.

14. The echo cancelling method of claim 9, wherein the updated offset value is substantially equal to a middle value between the two shift values corresponding to the two slicer levels.

15. The echo cancelling method of claim 10, further comprising:

receiving, by an updating circuit, the digital value and the second output signal so as to update the offset value corresponding to the digital value.

16. The echo cancelling method of claim 10, further comprising:

updating a plurality of filter coefficients of the second echo canceller circuit according to the second output signal and a least mean square calculation process.

* * * * *